(12) United States Patent
Ukai

(10) Patent No.: US 11,758,322 B2
(45) Date of Patent: Sep. 12, 2023

(54) SOUND PICKUP DEVICE AND SOUND PICKUP METHOD

(71) Applicant: YAMAHA CORPORATION, Hamamatsu (JP)

(72) Inventor: Satoshi Ukai, Waltham, MA (US)

(73) Assignee: YAMAHA CORPORATION, Hamamatsu (JP)

( * ) Notice: Subject to any disclaimer, the term of this patent is extended or adjusted under 35 U.S.C. 154(b) by 0 days.

(21) Appl. No.: 17/515,916

(22) Filed: Nov. 1, 2021

(65) Prior Publication Data

US 2022/0060816 A1 Feb. 24, 2022

Related U.S. Application Data

(60) Division of application No. 16/576,994, filed on Sep. 20, 2019, now Pat. No. 11,197,091, which is a
(Continued)

(51) Int. Cl.
*H04R 1/40* (2006.01)
*G10K 11/178* (2006.01)
*H04R 3/00* (2006.01)

(52) U.S. Cl.
CPC ........... *H04R 1/40* (2013.01); *G10K 11/1785* (2018.01); *H04R 3/005* (2013.01)

(58) Field of Classification Search
CPC .......... H04R 1/40; H04R 1/342; H04R 1/406; H04R 1/34; H04R 1/1083; H04R 3/005;
(Continued)

(56) References Cited

U.S. PATENT DOCUMENTS

| 4,862,278 A | * | 8/1989 | Dann | ............... | H04R 1/342 348/240.99 |
| 5,550,925 A | * | 8/1996 | Hori | ............... | H04R 3/005 381/98 |

(Continued)

FOREIGN PATENT DOCUMENTS

| CN | 102137318 A | 7/2011 |
| CN | 102209988 A | 10/2011 |

(Continued)

OTHER PUBLICATIONS

International Search Report issued in Intl. Appln. No. PCT/JP2017/012070 dated May 30, 2017. English translation provided.
(Continued)

*Primary Examiner* — Leshui Zhang
(74) *Attorney, Agent, or Firm* — ROSSI, KIMMS & McDOWELL LLP

(57) ABSTRACT

A sound pickup method includes splitting a sound pickup signal of a microphone of which sound pickup in a predetermined range is blocked by an acoustic obstacle, into a plurality of sound pickup signals and subjecting at least one sound pickup signal among the plurality of sound pickup signals to band limitation processing, and comparing characteristic amounts of the plurality of sound pickup signals including the sound pickup signal after being subjected to the band limitation processing and controlling a gain of the microphone in accordance with a result of comparing the characteristic amounts.

19 Claims, 15 Drawing Sheets

Related U.S. Application Data continuation of application No. PCT/JP2017/012070, filed on Mar. 24, 2017.

(58) Field of Classification Search
CPC .......... H04R 3/00; H04R 3/04; H04R 29/006; H04R 25/00; G10K 11/1785; G10K 11/178; G10K 11/1781; H03G 3/3005; H03G 3/30; H03G 3/301; H03G 3/32; H03G 3/34; G10L 15/08; G10L 21/02; G10L 21/0208; H04M 9/082
USPC ....... 381/71.1, 26, 91, 92, 111–115, 122, 56, 381/57, 61, 95, 97, 98, 99, 100, 101, 102, 381/103, 333; 700/94

See application file for complete search history.

(56) References Cited

U.S. PATENT DOCUMENTS

| | | | |
|---|---|---|---|
| 5,671,287 | A | 9/1997 | Gerzon |
| 8,867,773 | B2 | 10/2014 | Kimura |
| 9,194,938 | B2 | 11/2015 | Velusamy |
| 9,351,071 | B2 | 5/2016 | Kechichian |
| 9,426,566 | B2 | 8/2016 | Takahashi |
| 2005/0234715 | A1 | 10/2005 | Ozawa |
| 2012/0189147 | A1 | 7/2012 | Terada |
| 2012/0253798 | A1 | 10/2012 | Walters |
| 2012/0257779 | A1* | 10/2012 | Kimura .................. H04N 5/225 381/359 |
| 2014/0056429 | A1 | 2/2014 | Allen |
| 2014/0112483 | A1 | 4/2014 | Etter |
| 2015/0334489 | A1* | 11/2015 | Iyengar .................. H04R 3/04 381/71.6 |
| 2015/0341006 | A1 | 11/2015 | Jiang |
| 2016/0049161 | A1 | 2/2016 | Tsujikawa |

FOREIGN PATENT DOCUMENTS

| | | |
|---|---|---|
| CN | 102656903 A | 9/2012 |
| CN | 103797821 A | 5/2014 |
| CN | 104041075 A | 9/2014 |
| EP | 1862813 A1 | 12/2007 |
| EP | 1965603 A1 | 9/2008 |
| EP | 2346268 A1 | 7/2011 |
| EP | 2375781 A1 | 10/2011 |
| FR | 3036912 A1 | 12/2016 |
| JP | 63002500 A * | 1/1988 |
| JP | S632500 A | 1/1988 |
| JP | 2004289762 A | 10/2004 |
| JP | 2006323134 A | 11/2006 |
| JP | 2009272893 A | 11/2009 |
| JP | 2013061421 A | 4/2013 |
| JP | 2013170936 A | 9/2013 |
| JP | 2014143569 A | 8/2014 |
| WO | 2014125860 A1 | 8/2014 |

OTHER PUBLICATIONS

Written Opinion issued in Intl. Appln. No. PCT/JP2017/012070 dated May 30, 2017.
Lyon. "A Computational Model of Binaural Localization and Separation." Proceedings of the International Conference on Acoustics, Speech and Signal Processing. 1983: 1148-1151.
Office Action issued in Japanese Appln. No. 2019-506897 dated Jun. 23, 2020. English translation provided.
Extended European Search Report issued in European Appln. No. 17901745.4 dated Oct. 20, 2020.
Georganti. "Speaker Distance Detection Using a Single Microphone." IEEE Transactions on Audio, Speech, and Language Processing. Sep. 2011: 1949-1961. vol. 19, No. 7.
Office Action issued in Chinese Appln. No. 201780088836.3 dated Nov. 2, 2020. English machine translation provided.
Office Action issued in Chinese Appln. No. 201780088836.3 dated Jun. 15, 2021. English machine translation provided.
Office Action issued in Japanese Appln. No. 2020-139755 dated Jul. 13, 2021. English machine translation provided.
Office Action issued in U.S. Appl. No. 16/576,994 dated Feb. 1, 2021.
Office Action issued in U.S. Appl. No. 16/576,994 dated Jun. 28, 2021.
Notice of Allowance issued in U.S. Appl. No. 16/576,994 dated Sep. 10, 2021.

* cited by examiner

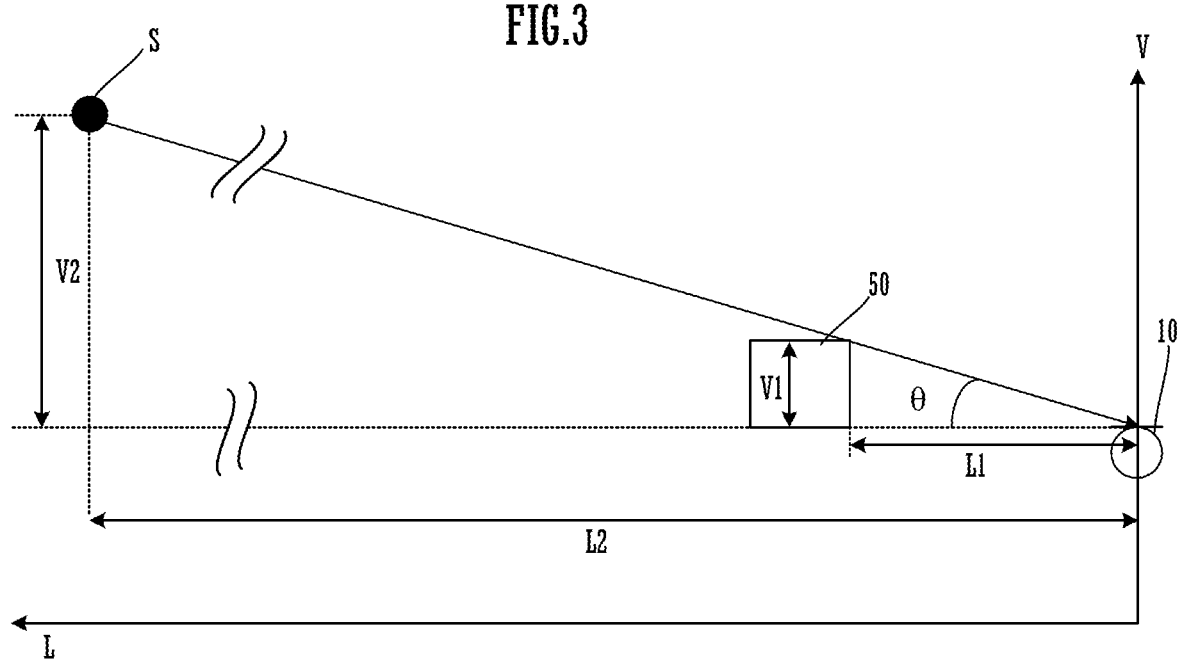

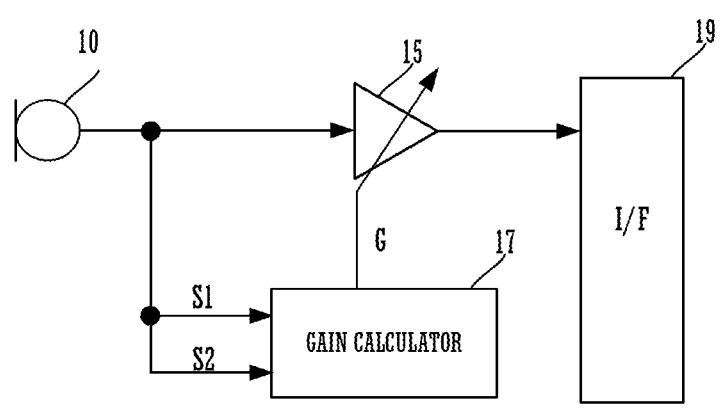

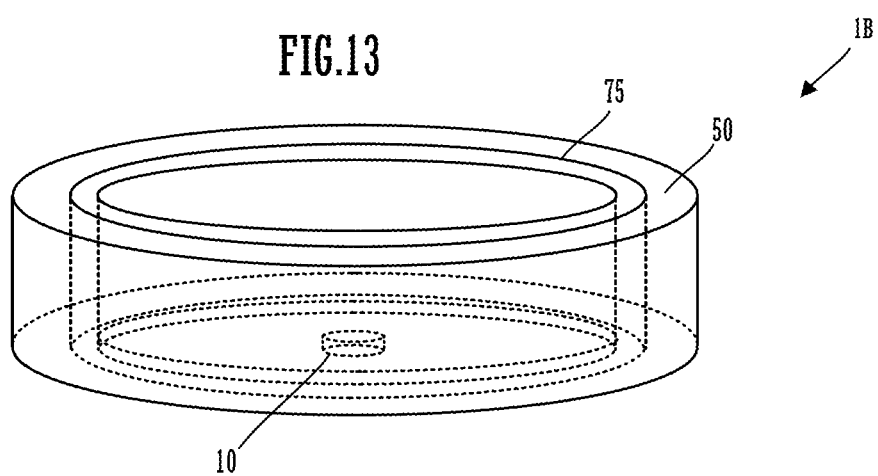

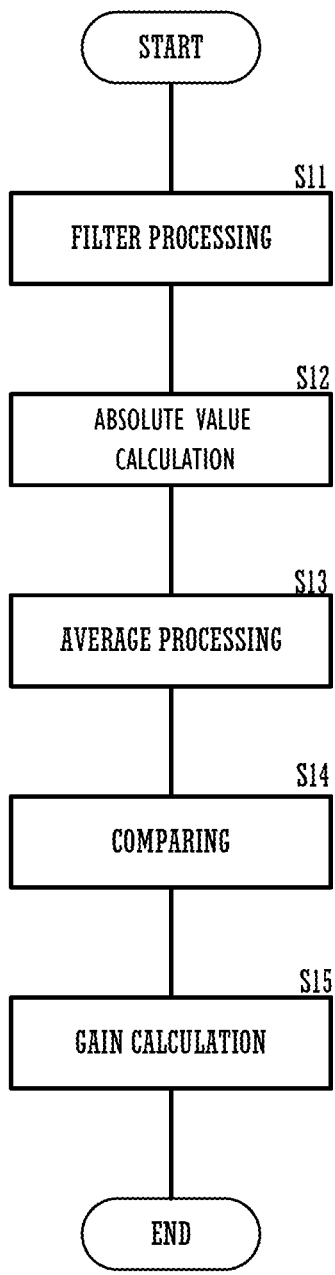

SOUND PICKUP DEVICE AND SOUND PICKUP METHOD

CROSS REFERENCE TO RELATED APPLICATIONS

The present application is a continuation of International Application No. PCT/JP2017/012070, filed on Mar. 24, 2017, the entire contents of which is incorporated herein by reference.

BACKGROUND OF THE INVENTION

1. Field of the Invention

One preferred embodiment of the present invention relates to a sound pickup device that acquires sounds of a sound source by using a microphone, and a sound pickup method.

2. Description of the Related Art

To acquire sounds of a sound source appropriately by using a microphone, it is considered to measure a distance between the sound source and the microphone, for example. As a method of measuring a distance between the sound source and the microphone, the sound-source position determining device described in Unexamined Japanese Patent Publication No. 2013-170936 or the technique of R. F. Lyon, A computational model of binaural localization and separation, In Proceedings of the International Conference on Acoustics, Speech and Signal Processing, pages 1148-1151, 1983, is known, for example.

The sound-source position determining device of Unexamined Japanese Patent Publication No. 2013-170936 calculates an arrival time difference between a direct sound and a reflected sound. For instance, the shorter a distance between a microphone and a sound source is, the faster the direct sound reaches the microphone. This increases the arrival time difference between the direct sound and the reflected sound. Conversely, the arrival time difference between a direct sound and an indirect sound is reduced as the distance between the microphone and the sound source becomes long.

In the technique of R. F. Lyon, A computational model of binaural localization and separation, In Proceedings of the International Conference on Acoustics, Speech and Signal Processing, pages 1148-1151, 1983, a position of the sound source is estimated by using the fact that an arrival time difference occurs between a right ear and a left ear.

For the reflected sound, however, the arrival time is varied depending on environment, such as a size of a room. Accordingly, in the method of using the reflected sound, like Unexamined Japanese Patent Publication No. 2013-170936, the environment is likely to cause an error in a value of the distance to be estimated. Further, in the technique of R. F. Lyon, A computational model of binaural localization and separation, In Proceedings of the International Conference on Acoustics, Speech and Signal Processing, pages 1148-1151, 1983, sounds coming from the same direction have the same arrival time difference between a direct sound and a reflected sound. This makes it difficult to estimate the distance.

SUMMARY OF THE INVENTION

One preferred embodiment of the present invention aims to provide a sound pickup device that acquires sounds of a sound source appropriately without depending on environment such as a reflected sound, and a sound pickup method.

A sound pickup device according to a preferred embodiment of the present invention includes a microphone, an acoustic obstacle, a signal processor, and a gain controller. The acoustic obstacle blocks sound pickup in a predetermined range with respect to the microphone. The signal processor splits a sound pickup signal of the microphone into a plurality of sound pickup signals, and subjects at least one sound pickup signal among the plurality of sound pickup signals to band limitation processing. The gain controller compares characteristic amounts of the plurality of sound pickup signals including the sound pickup signal after being subjected to the band limitation processing by the signal processor, and controls a gain of the microphone in accordance with a result of comparing the characteristic amounts.

Alternatively, the sound pickup device according to a preferred embodiment of the present invention includes a first microphone, a second microphone, an acoustic obstacle, and a gain controller. The acoustic obstacle blocks sound pickup in a predetermined range with respect to the first microphone. The gain controller compares a first characteristic amount of a sound pickup signal of the first microphone and a second characteristic amount of a sound pickup signal of the second microphone, and controls a gain of the first microphone or the second microphone in accordance with a result of comparing the first characteristic amount and the second characteristic amount.

According to one preferred embodiment of the present invention, sounds of a sound source can be acquired appropriately, without depending on environment such as a reflected sound.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a view showing a positional relationship between a microphone, an acoustic obstacle, and a speaker.

FIG. 4 is a block diagram of the sound pickup device.

11B is a view showing a state where a voice from a speaker remote from the sound pickup device reaches.

Figure 12:
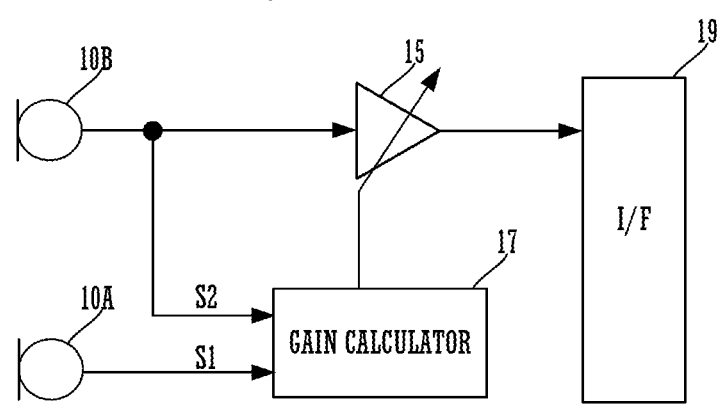

FIG. 12 is a block diagram of a sound pickup device.

FIG. 13 is a view showing a structure of a sound pickup device in accordance with a first modification.

Figure 14A:
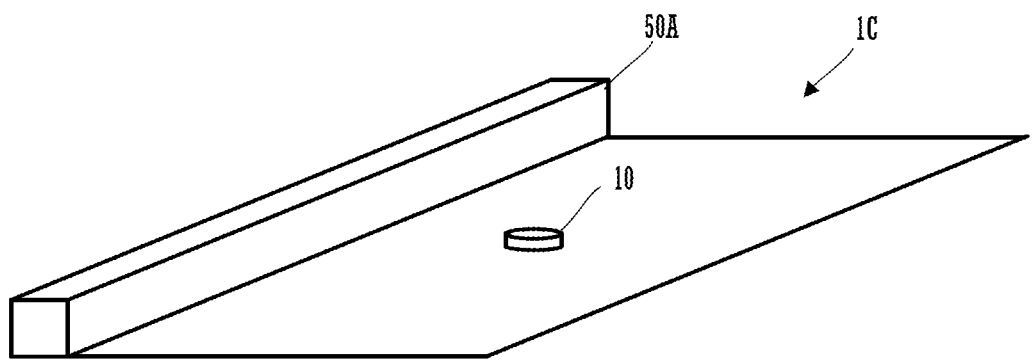
Figure 14B:
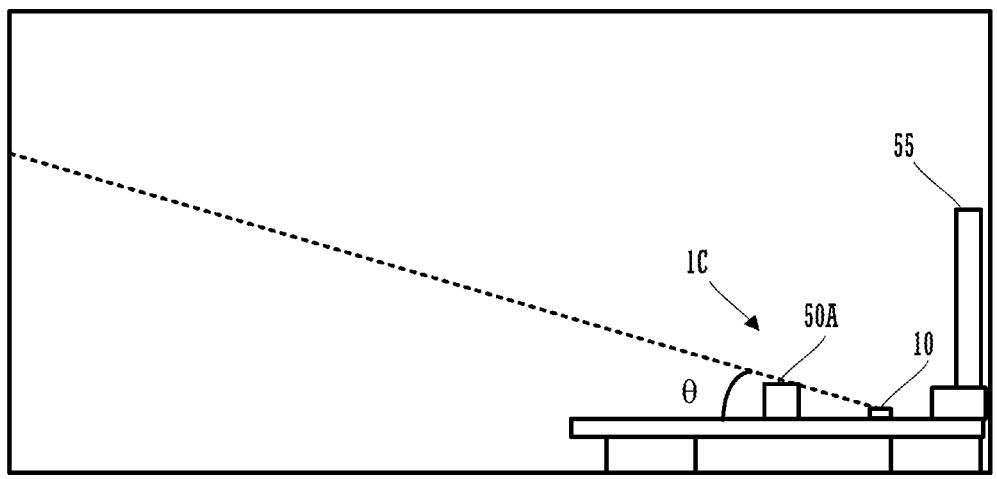
Figure 14C:
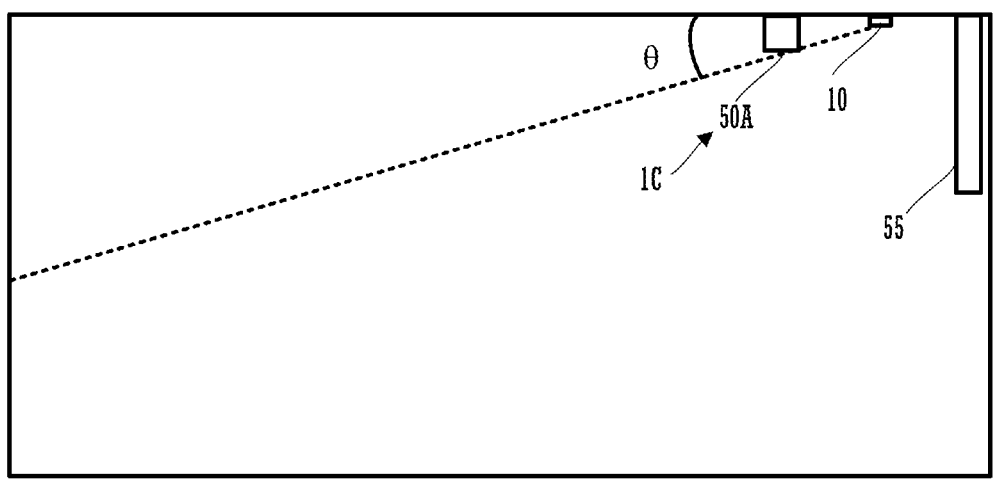

FIG. 14A is a perspective view showing a structure of a sound pickup device in accordance with a second modification, FIG. 14B is a transverse sectional view of an indoor room, and FIG. 14C is an example of a transverse sectional view of an indoor room different from FIG. 14B.

FIG. 15 is a flowchart showing an operation of the gain calculator.

DETAILED DESCRIPTION OF THE PREFERRED EMBODIMENTS

First Preferred Embodiment

Figure 1:
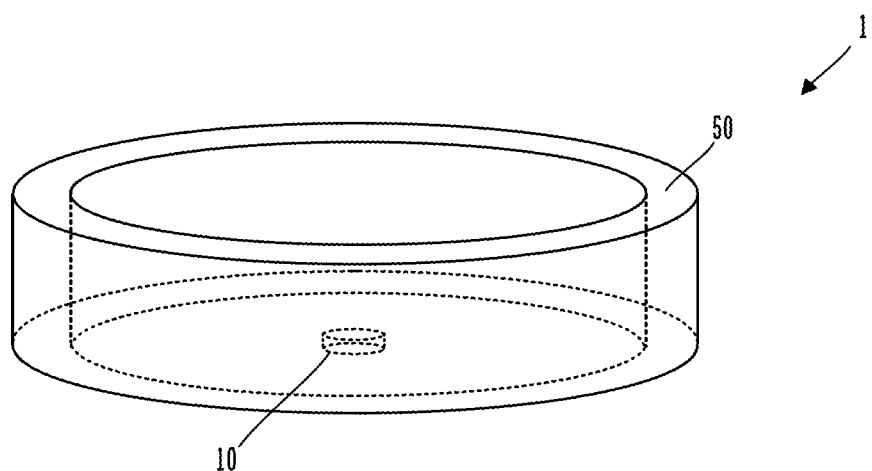
FIG. 1 is a schematic view showing a structure of a sound pickup device.

FIG. 1 is a schematic view showing a structure of a sound pickup device 1 in accordance with a first preferred embodiment. In FIG. 1, a main structure in accordance with sound pickup is shown, and the other structure is not shown. The sound pickup device 1 includes a housing 50 with a cylindrical shape, and a microphone 10.

The housing 50 is made of metal or resin that has sound insulating properties. In other words, the housing 50 is an example of an acoustic obstacle of the present invention. When viewed in plan view, a center portion of the housing 50 is opened acoustically.

The microphone 10 is disposed in a cylinder of the housing 50. The microphone 10 is hidden by the housing 50, when viewed in a horizontal direction of an installation surface (e.g., a desk top surface) on which the sound pickup device 1 is installed. The microphone 10 is acoustically opened from the housing 50 at a predetermined angle or more with respect to the horizontal direction of the installation surface on which the sound pickup device 1 is installed.

Figure 2A:
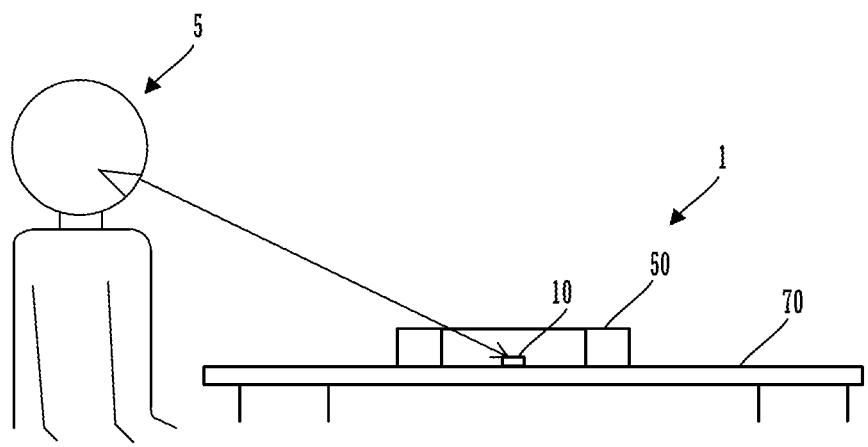
FIG. 2A is a view showing a state where a voice from a speaker close to the sound pickup device reaches.
Figure 2B:
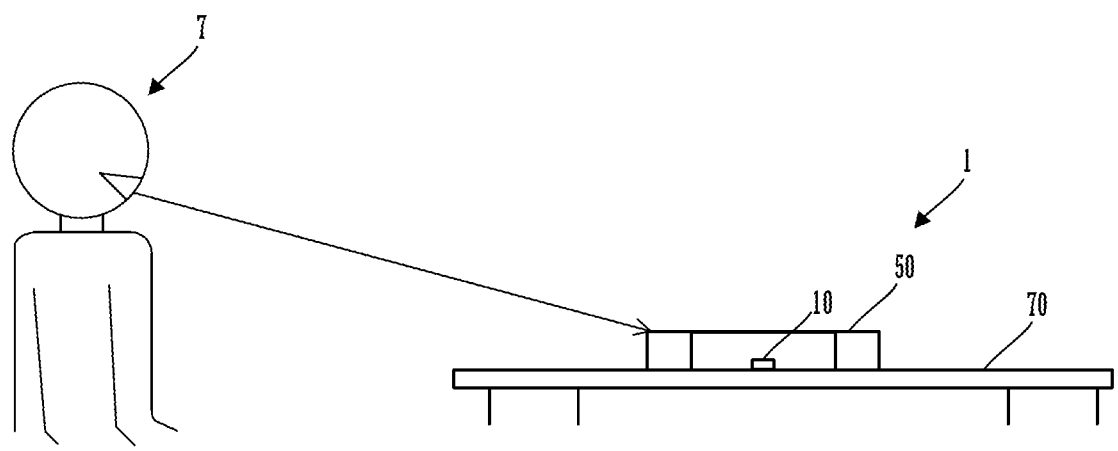
FIG. 2B is a view showing a state where a voice from a speaker remote from the sound pickup device reaches.

The housing 50 is installed on a desk top surface 70, as shown in FIGS. 2A and 2B. As shown in FIG. 2A, a voice emitted from a speaker 5 located in a position comparatively closer to the sound pickup device 1 than a speaker 7 shown in FIG. 2B reaches the microphone 10 directly, without being blocked by the housing 50. As shown in FIG. 2B, however, a voice emitted from a speaker 7 located in a position comparatively farther from the sound pickup device 1 than the speaker 5 shown in FIG. 2A is blocked by the housing 50. As for the voice emitted from the speaker 7 located in a position remote from the sound pickup device 1, only a component (mainly a low-band component) traveling around the housing 50 reaches the microphone 10.

FIG. 3 is a view showing a positional relationship between the microphone 10, the housing 50 serving as an acoustic obstacle, and a speaker (sound source) S. As shown in FIG. 3, in the sound pickup device 1, a sound of the sound source S is blocked by the housing 50 at a predetermined angle θ or less with respect to the desk top surface 70 (horizontal direction).

A range in which the sound of the sound source S is blocked is determined by a relationship between a position of the microphone 10, a distance L1 to the housing 50, and a height V1 of the housing 50. For instance, if L1/V1=1 is satisfied, an angle θ0=45 degrees will be obtained. Typically, when a speaker sits on a chair to hold a meeting or the like, a speaker's face is located at a height of approximately 30 cm (V2=30 cm) from the desk top surface 70. Accordingly, if L1/V1=1=L2/V2 is satisfied, L2=V2 will be obtained. A voice of a speaker within a range, which is centered around a position of the microphone 10 and has a radius of approximately 30 cm, is not blocked by the housing 50. On the other hand, a voice of a speaker in a range whose distance L from the microphone 10 exceeds approximately 30 cm is blocked by the housing 50.

Alternatively, if L1/V1=3.33 is almost satisfied, an angle θ=16 degrees will be obtained. Further, if L1/V1=3.33=L2/V2 is satisfied, L2=3.33×V2 will be obtained. In such a case, a voice of a speaker within a range having a radius of approximately 100 cm is not blocked by the housing 50. On the other hand, a voice of a speaker in a range whose distance L from the microphone 10 exceeds approximately 100 cm is blocked by the housing 50.

Typically, in the case of holding a meeting or the like, a speaker is located within a range whose distance from a closest position to a desk is approximately 100 cm. Accordingly, a ratio (L1/V1) of L1 to V1 is desired to be set to approximately a value ranging from 1 to 3.33. Thus, a voice of a speaker in a range having a radius of approximately 30 cm to 100 cm reaches the microphone 10 without being blocked by the housing 50 while a voice of a speaker out of the range having a radius of approximately 30 cm to 100 cm is blocked by the housing 50.

FIG. 4 is a block diagram of the sound pickup device 1. The sound pickup device 1 includes the microphone 10, a gain adjuster 15, a gain calculator 17, and an interface (I/F) 19.

A sound pickup signal, which is the voice acquired by the microphone 10, is subjected to gain adjustment in the gain adjuster 15 and inputted to the I/F 19. The I/F 19 is, for example, a communication I/F and transmits the sound pickup signal to an external device (remote area). Alternatively, the I/F 19 outputs the sound pickup signal to a storage (not shown). The storage records the sound pickup signal, which is acquired by the microphone 10, as recording data.

The gain calculator 17 sets a gain G of the gain adjuster 15. A gain controller in the present invention is constituted by the gain adjuster 15 and the gain calculator 17. The sound pickup signal is inputted to the gain calculator 17. Herein, the sound pickup signal is split into a plurality of sound pickup signals (a sound pickup signal S1 and a sound pickup signal S2). Note that, the function of the gain adjuster 15 and the gain calculator 17 can be achieved by a common information processor, such as a personal computer. In this case, the information processor reads out a program stored in a storage medium, such as a flash memory, and executes the program, thereby achieving the function of the gain adjuster 15 and the gain calculator 17.

Figure 5:
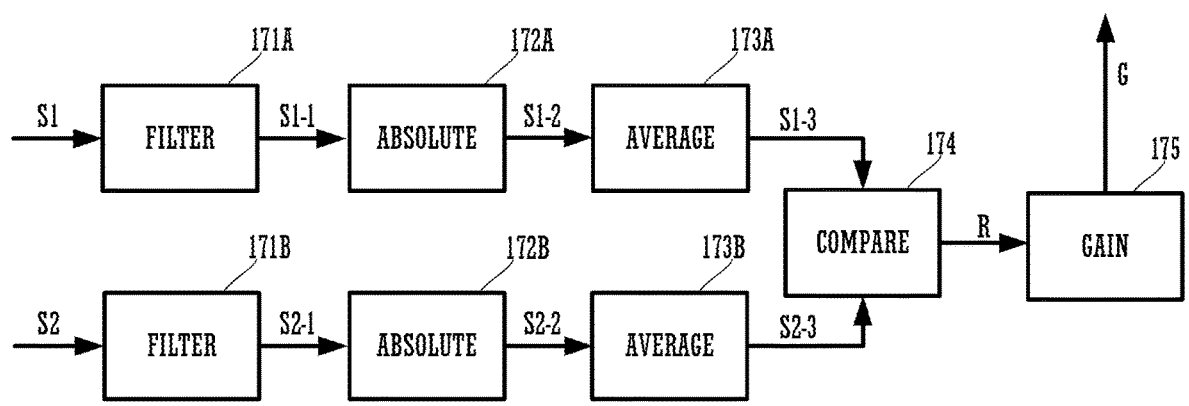
FIG. 5 is a block diagram of a gain calculator 17.

FIG. 5 is a block diagram (functional block diagram) showing a configuration of the gain calculator 17. Further, FIG. 15 is a flowchart showing an operation of the gain calculator 17. The gain calculator 17 includes a filter (Filter) 171A, a filter 171B, an absolute value calculator (Absolute) 172A, an absolute value calculator 172B, an average processor (Average) 173A, an average processor 173B, a comparator (Compare) 174, and a gain calculator (Gain) 175.

The sound pickup signal S1 is inputted to the filter 171A, and the sound pickup signal S2 is inputted to the filter 171B. The filter 171A and the filter 171B each perform band limitation processing (S11).

The filter 171A and the filter 171B perform extracting processing of a signal level of a band in which a difference in acoustic characteristic amount occurs between the voice emitted from a speaker located in a position close to the sound pickup device 1 and the voice emitted from a speaker located in a position remote from the sound pickup device 1.

For instance, the filter 171A is low-band limitation processing (high-pass filter). In addition, the filter 171B is all-band pass processing (all-pass filter), for example. As mentioned above, the voice emitted from the speaker located in a position close to the sound pickup device 1 reaches the microphone 10, without being blocked by the housing 50. As for the voice emitted from a speaker located in a position remote from the sound pickup device 1, a component (mainly low-band component) traveling around the housing 50 reaches the microphone 10. Accordingly, when the speaker located in a position close to the sound pickup device 1 emits voice, a significant output level difference does not occur between an output signal of the filter 171B and an output signal of the filter 171A. On the other hand, when the speaker located in a position remote from the sound pickup device 1 emits voice, a high-band component of the voice emitted from the speaker is blocked by the housing 50, so that the voice of the speaker is difficult to reach the microphone 10. When the speaker located in a position far from the sound pickup device 1 emits voice, the output level of the output signal of the filter 171A is remarkably reduced, thereby increasing the output level difference between the output signal of the filter 171B and the output signal of the filter 171A.

An output signal (sound pickup signal) S1-1 of the filter 171A is subjected to absolute value processing in the absolute value calculator 172A and calculated as a power value S1-2 (S12). The calculated power value is averaged over a predetermined time range in the average processor 173A to obtain an average power value S1-3 (S13). An output signal (sound pickup signal) S2-1 of the filter 171B is subjected to absolute value processing in the absolute value calculator 172B and calculated as a power value S2-2 (S12). The calculated power value is averaged over a predetermined time range in the average processor 173B to obtain an average power value S2-3 (S13).

Figure 6:
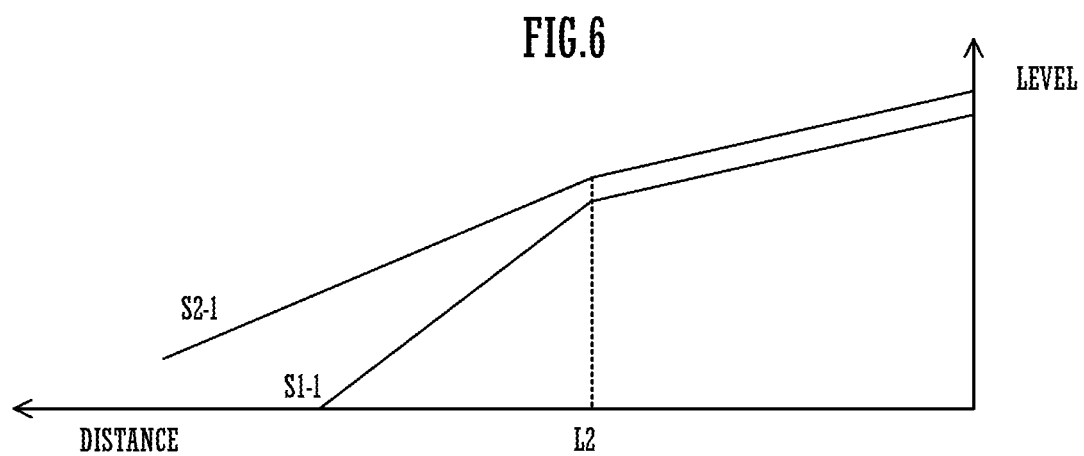
FIG. 6 is a view showing a relationship between a distance and a level of each sound pickup signal.

The comparator 174 calculates a value R (S14). The value R is obtained by dividing an output value (average power value) S1-3 of the average processor 173A by an output value (average power value) S2-3 of the average processor 173B. The division is an example of a method for comparing the acoustic characteristic amount. Other than this, the comparator 174 is subtracts the output value of the average processor 173A from the output value of the average processor 173B, and the resulting differential value may be defined as the value R, for example. FIG. 6 is a view showing a relationship between a distance and a level of each sound pickup signal. A level (e.g., power value) of the sound pickup signal S2-1 decreases as a distance from the microphone 10 becomes long. As shown in FIG. 3, at a position farther than the distance L2, the arrival of voice is blocked by the housing 50. Thus, the degree of reduction in a level of the sound pickup signal S2-1 is increased as the distance from the microphone 10 becomes long.

On the other hand, up to the distance L2, the output signal S1-1 is decreased as the distance from microphone 10 becomes long, like the output signal S2-1. At a position farther than the distance L2, the arrival of voice is blocked by the housing 50, and the low-band component, which is easy to travel around the microphone 10, is cut off. Therefore, the degree of reduction in a level of the output signal S1-1 is further increased, compared with the output signal S2-1, as the distance from the microphone 10 becomes long. Consequently, the value R is reduced significantly, when the sound source is located at a position farther than the distance L2.

Figure 7:
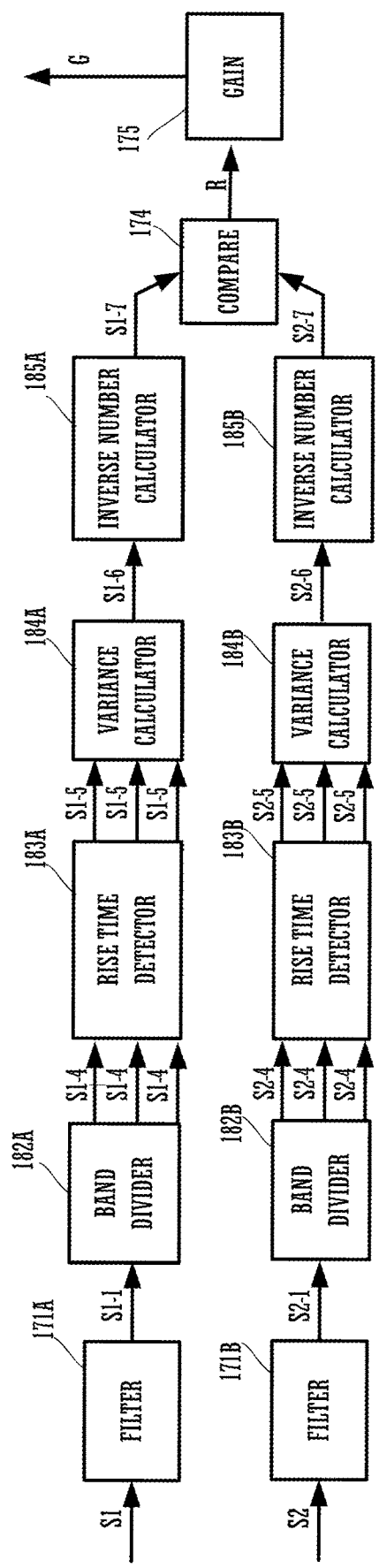
FIG. 7 is a block diagram of the gain calculator 17 in the case where an inverse of variance of voice rising time is used as a voice characteristic amount.

Further, the sound pickup device 1 may calculate the value R using the inverse of variance of voice rising time in a different frequency band, as a characteristic amount. FIG. 7 is a block diagram (functional block diagram) showing a configuration of the gain calculator 17 when the inverse of variance of voice rising time in a different frequency band is used as the characteristic amount.

The gain calculator 17 includes a filter 171A, a filter 171B, a band divider 182A, a band divider 182B, a rise time detector 183A, a rise time detector 183B, a variance calculator 184A, a variance calculator 184B, an inverse number calculator 185A, an inverse number calculator 185B, a comparator 174, and a gain calculator 175.

In this case, an output signal S1-1 of the filter 171A is inputted to the band divider 182A, and then divided into still fine bands to obtain a signal S1-4. The signal S1-4 is inputted to the rise time detector 183A. An output signal S2-1 of the filter 171B is inputted to band divider 183B, and then divided into still fine bands to obtain a signal S2-4. The signal S2-4 is inputted to the rise time detector 183B. The rise time detector 183A calculates the time when a level of the signal S1-4 exceeds a given threshold, and outputs it as a time value S1-5. The time value S1-5 is inputted to the variance calculator 184A. The rise time detector 182B calculates the time when a level of the signal S2-4 exceeds a given threshold, and outputs it as a time value S2-5. The time value S2-5 is inputted to the variance calculator 184B. The variance calculator 184A calculates a variance value of the time value S1-5 related to the band, and outputs it as a variance value S1-6. The variance value S1-6 is converted into an inverse number S1-7 through the inverse number calculator 185A. The variance calculator 184B calculates a variance value of the time value S2-5 related to the band, and outputs it as a variance value S2-6. The variance value S2-6 is converted into an inverse number S2-7 through the inverse number calculator 185B. The comparator 174 divides the inverse number S1-7 by the inverse number S2-7 to output a value R to the gain calculator 175.

Figure 8:
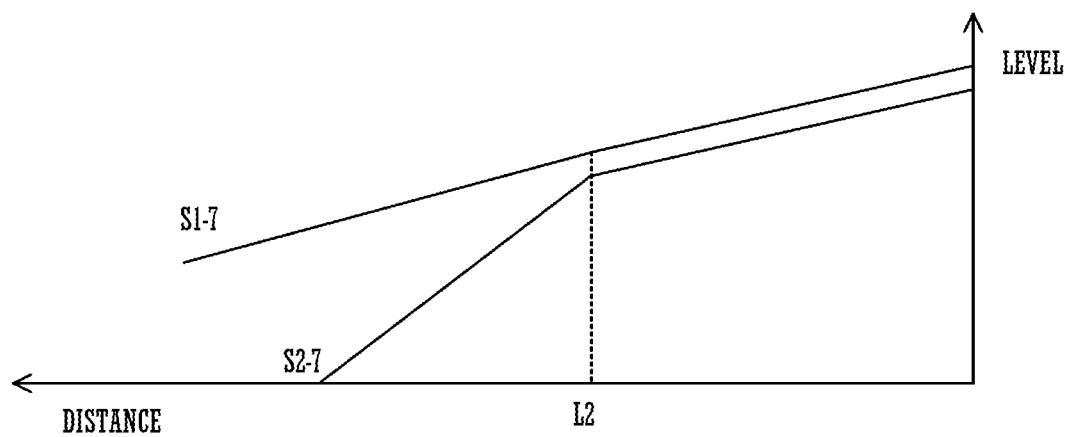
FIG. 8 is a view showing a relationship between a distance and an inverse of variance of voice rising time in the case where the inverse of variance of voice rising time is used as the voice characteristic amount.

FIG. 8 is a view showing a relationship between a distance, and the inverse number S1-7 and the inverse number S2-7. Since an all-pass filter is applied in the filter 171A, the output signal S1-1 includes a low-band component, which is hard to be affected by an acoustic obstacle. Accordingly, in the output signal S1-1, a direct sound is dominant rather than an indirect sound due to reflection in a room or the like, even if a position of the sound source is closer or farther than the distance L2. The time value S1-5, which indicates the time when a sound wave reaches, is almost the same for every frequency, because the direct sound travels on the shortest path from the sound source to the microphone 10. Therefore, the variance value S1-6, which indicates variance of rise time, is reduced, so that the inverse number S1-7, which indicates an inverse of variance of rise time, has a large value.

On the other hand, since a high-pass filter is applied in the filter 171B, only a component easily affected by an acoustic obstacle exists in the output signal S2-1. As shown in FIG. 3, at a position farther than the distance L2, the arrival of direct sound is blocked by the housing 50. Accordingly, a proportion of the indirect sound in the output signal S2-1 is increased as the distance from the microphone 10 becomes long. Since the indirect sound reaches the microphone 10 after being reflected on the inside of a room repeatedly, the arrival time differs significantly depending on frequency. Thus, the variance value S2-6 of rise time is further increased, and the inverse number S2-7 is reduced seriously. Therefore, if it exceeds the distance L2, the inverse number S1-7 and the inverse number S2-7 will differ from each other significantly. Consequently, when a position of the sound source is farther than the distance L2, the value R is reduced significantly.

Figure 9A:
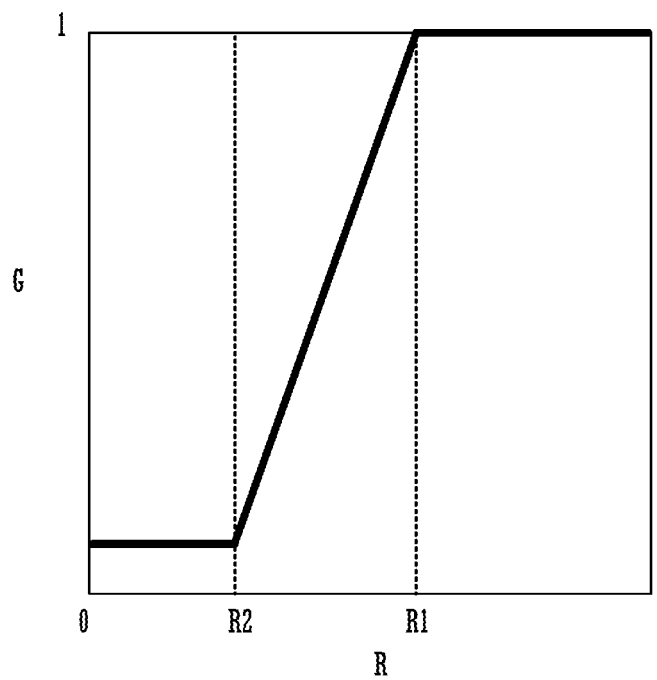
FIG. 9A is a view showing a gain table and FIG. 9B is a view showing a gain table different from FIG. 9A.

The gain calculator 175 calculates a gain G according to the value R (S15). FIG. 9A is a view showing an example of a gain table. In the gain table shown in FIG. 9A, when the value R is more than or equal to a predetermined value R1, the gain G is not attenuated. When the value R is between the predetermined value R1 and the predetermined value R2, the gain G is set to be attenuated as the value R is reduced. When the value R is smaller than the predetermined value R2, the gain G maintains the minimum gain value.

When a position of the sound source is farther than the distance L2, the value R is decreased according to an increase in the distance from the microphone 10. The predetermined value R1 and the predetermined value R2 may be set optionally. However, the predetermined value R1 is set according to the maximum range in which sound pickup is desired to be performed without attenuating the gain G. For instance, a ratio (L1/V1) of L1 to V1 is assumed to be 1. When a position of the sound source is farther than a radius of approximately 30 cm, the value R is reduced. However, the sound pickup device 1, by setting a value R obtained when the distance is approximately 40 cm to the predetermined value R1, can picked up a sound without attenuating the gain G, up to a radius of approximately 40 cm. Further, the predetermined value R2 is set according to the minimum range in which the attenuation of the gain G is desired. For instance, the sound pickup device 1 sets a value R obtained when the distance is 100 cm to the predetermined value R2, so that sound pickup will scarcely be performed when the distance is more than or equal to 100 cm. When the distance is closer than 100 cm, the gain gradually increases, so that sound pickup is performed.

Further, the predetermined values R1 and R2 are not a fixed value, but may be changed dynamically. For instance, among the values R that have been calculated in the past time within predetermined time, the maximum value is determined as a value R0 to obtain the predetermined value R1=R0+0.1 and the predetermined value R2=R0−0.1. Thus, with the current position of the sound source as a reference, a sound in a range closer to the microphone 10 than the position of the sound source is picked up, and a sound farther than the position of the sound source is not picked up.

Figure 9B:
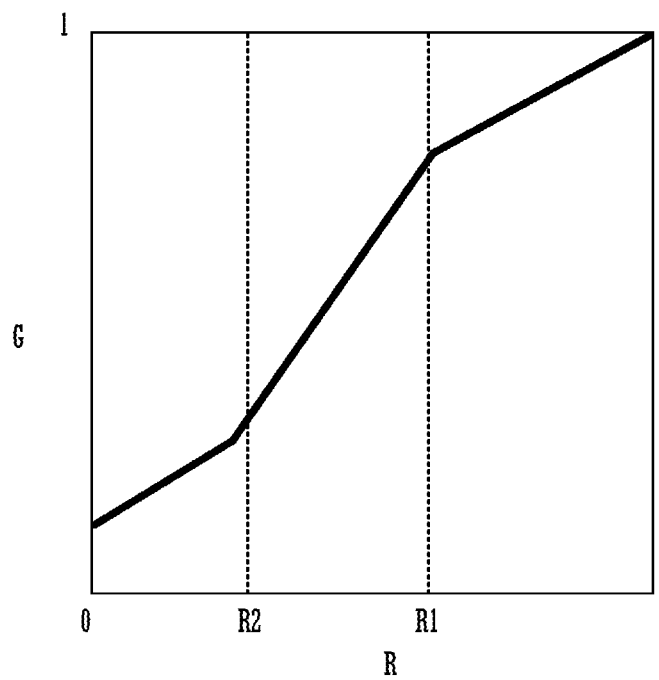

The example of FIG. 9A is an aspect in which the gain G decreases rapidly from a predetermined distance (e.g., 30 cm) and the sound source whose position is farther than a predetermined distance (e.g., 100 cm) is scarcely picked up, which is similar to the function of a limiter. Other than this, however, various kinds of aspects can be considered as the gain table, as shown in FIG. 9B. The example of FIG. 9B is an aspect in which the gain G gradually decreases according to the distance, the degree of decrease in the gain G is increased from a predetermined distance (e.g., 30 cm), and the gain G gradually decreases again at more than or equal to a predetermined distance (e.g., 100 cm), which is similar to the function of a compressor.

As mentioned above, the sound pickup device 1 in the present preferred embodiment has an aspect that picks up a sound of the sound source whose distance from the microphone 10 is within a predetermined range, and does not pick up a sound out of the predetermined range. Accordingly, the sound pickup device 1 in the present preferred embodiment is able to reduce a sound source (e.g., noise) in a remote place, remarkably. In technique of the present preferred embodiment, also for a sound coming from the same direction, the gain G can be adjusted according to the distance from the sound source to the sound pickup device 1 (the microphone 10) without depending on a size of room, such as a reflected sound.

Second Preferred Embodiment

Figure 10:
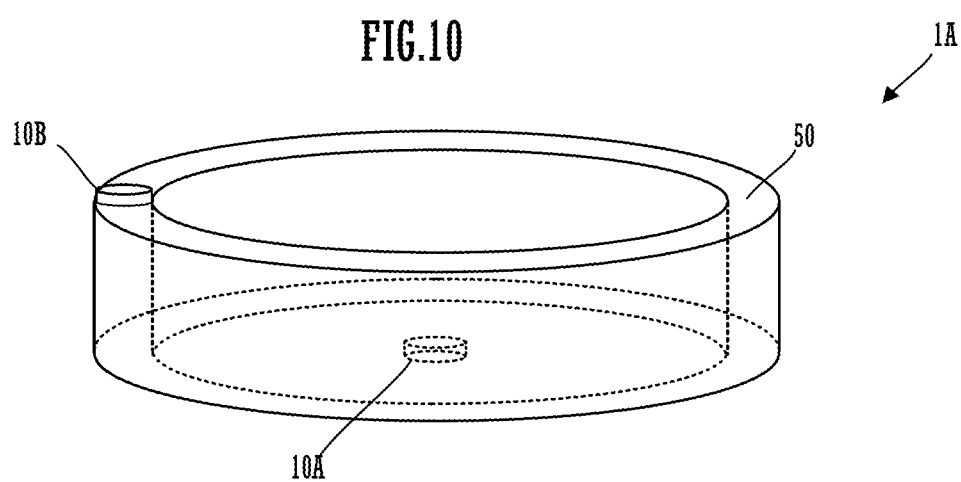
FIG. 10 is a schematic view showing a structure of a sound pickup device including a plurality of microphones.

Next, FIG. 10 is a schematic view showing a structure of a sound pickup device 1A in accordance with a second preferred embodiment. Also in FIG. 10, a main structure in accordance with sound pickup is shown, and the other structure is not shown. The sound pickup device 1A includes two microphones, i.e., a microphone 10A and a microphone 10B.

In the sound pickup device 1A of this example, the microphone 10A is disposed in a cylinder of the housing 50. In other words, the microphone 10A has the same structure as that of the microphone 10 shown in FIG. 1. In the sound pickup device 1A, the microphone 10B is disposed on an upper surface of a peripheral wall of the housing 50.

Figure 11A:
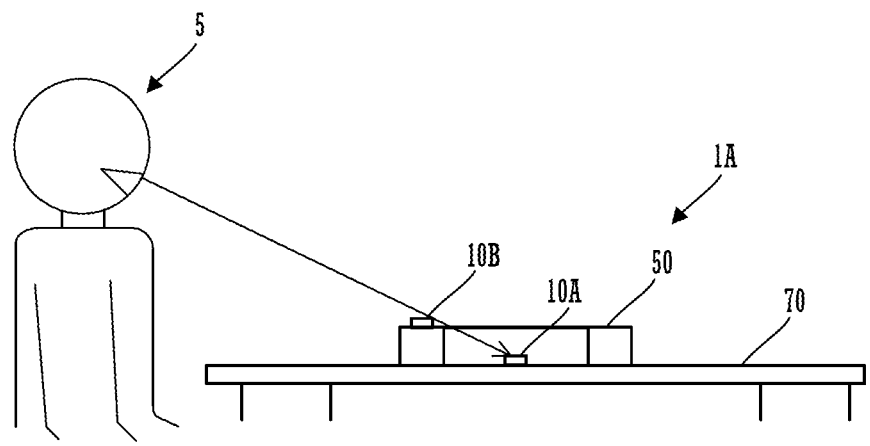
FIG. 11A is a view showing a state where a voice from a speaker close to the sound pickup device reaches, and FIG.
Figure 11B:
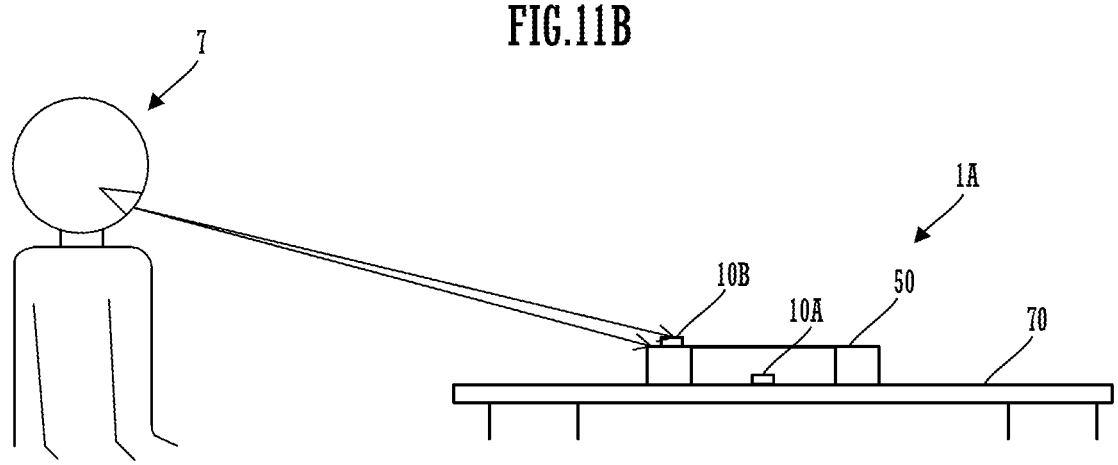

As shown in FIGS. 11A and 11B, the microphone 10B is allowed to acquire not only a voice emitted from a speaker 5 located in a position close to the sound pickup device 1, but also a voice emitted from a speaker 7 located in a position remote from the sound pickup device 1, without being blocked by the housing 50.

Note that, it is not essential that the microphone 10B is disposed on the upper surface of the peripheral wall of the housing 50. For instance, the microphone 10B may be disposed on an outer circumference surface of housing 50, or may be disposed in a position away from the housing 50.

FIG. 12 is a block diagram of the sound pickup device 1A. The sound pickup device 1A includes the microphone 10A, the microphone 10B, a gain adjuster 15, a gain calculator 17, and an interface (I/F) 19.

A sound pickup signal S1 of the microphone 10A is inputted to the gain calculator 17. A sound pickup signal S2 of the microphone 10B is inputted to the gain adjuster 15 and the gain calculator 17. The sound pickup signal S2 of the microphone 10B is subjected to gain adjustment in the gain adjuster 15, and inputted to the I/F 19.

Note that, this example shows an aspect in which a gain of the sound pickup signal S2 of the microphone 10B is adjusted and outputted to the I/F 19. However, in this example, an aspect in which a gain G of the sound pickup signal S1 of the microphone 10A is adjusted and outputted to the I/F 19 may be employed. Since the microphone 10A, however, is disposed inside the housing 50 with a cylindrical shape, reflected sounds inside the housing 50 are likely to be picked up, thereby causing a dip or a peak in a predetermined frequency. Therefore, it is preferred that the gain G of the sound pickup signal S2 of the microphone 10B is adjusted and outputted to the I/F 19.

A configuration of the gain calculator 17 is the same as that of the gain calculator 17 in the first preferred embodiment shown in FIG. 5. However, pass bands of the filter 171A and the filter 171B are set in a band in which the values R are most different between a speaker located in a position close to the sound pickup device 1 and a speaker located in a position remote from the sound pickup device 1. For instance, both the filter 171A and the filter 171B are low-band limitation processing (high-pass filter) that passes a signal with a band of 1 kHz or more. For the other configurations, the same processing is performed as in the first preferred embodiment.

Note that, in the second preferred embodiment, the band limitation processing through the filter 171A and the filter 171B is not essential. Even if the band limitation processing through the filter 171A and the filter 171B is not performed, in the sound pickup device 1A of the second preferred embodiment, with respect to a remote sound source, sound pickup to the microphone 10A is blocked by the housing 50 and sound pickup to the microphone 10B is not blocked by the housing 50. Accordingly, between the sound picked up by the microphone 10A and the sound picked up by the microphone 10B, the level is different physically. Therefore, even if the band limitation processing through the filter 171A and the filter 171B is not performed, in a remote place beyond a predetermined distance, the divided value R is reduced as the distance from the sound source is increased.

Accordingly, like the first preferred embodiment, the sound pickup device 1A of the second preferred embodiment also has an aspect in which a sound of a sound source whose distance from the microphone 10A is within a predetermined range is picked up, and a sound out of the predetermined range is not picked up. This makes it possible to reduce a sound source (e.g., noise) in a remote place, remarkably. Even in the second preferred embodiment, also for a sound coming from the same direction, the gain G can be adjusted according to the distance from the sound source to the sound pickup device 1 (the microphone 10) without depending on a size of room, such as a reflected sound.

FIG. 13 is a schematic view showing a structure of a sound pickup device 1B in accordance with a first modification. The sound pickup device 1B has a sound-absorbing material 75 disposed inside a cylinder of the housing 50. The other structure is the same as that of the sound pickup device 1.

Since the sound-absorbing material 75 is disposed inside the cylinder of the housing 50, the sound pickup device 1B in accordance with the first modification can control reflected sounds inside the cylinder. This makes it possible to prevent occurrence of unnecessary dips or peaks in a frequency characteristic of the sound pickup signal of the microphone 10.

Note that, in the second preferred embodiment, the sound-absorbing material 75 may also be disposed inside the cylinder of the housing 50.

Next, FIG. 14A is a schematic view showing a structure of a sound pickup device 1C in accordance with a second modification. FIGS. 14B and 14C are examples of a transverse sectional view of an indoor room in which the sound pickup device 1C is installed.

The sound pickup device 1C in the second modification includes an acoustic obstacle 50A with a rectangular parallelepiped shape, and a microphone 10. The other structure is the same as that of the block diagram shown in FIGS. 4 and 5. The housings (acoustic obstacles) 50 of the sound pickup device 1A and the sound pickup device 1B have a cylindrical shape (the shape is circular when viewed in plan view), but the acoustic obstacle may have a rectangular shape when viewed in plan view. The acoustic obstacle, other than this, may have various kinds of shapes, such as a semi-circle, an elliptical shape, and a polygon when viewed in plan view.

The acoustic obstacle 50A is disposed near the microphone 10. The microphone 10 is hidden by the housing 50 in a horizontal direction of a plane on which the sound pickup device 1 is installed. The microphone 10 is acoustically opened from the housing 50 at a predetermined angle or more with respect to the horizontal direction of the plane on which the sound pickup device 1 is installed.

The acoustic obstacle 50A, however, has an example (rectangular parallelepiped shape) of a rectangular shape when viewed in plan view. Thus, sound pickup to the microphone 10 is blocked in only a specified direction, rather than all circumferential directions. For instance, in the example of FIG. 14B, the sound pickup device 1C is installed in a front lower part of a display (indicator) 55, and does not pick up a sound in a range having a predetermined angle θ or less among front directions of the display 55.

In the case where being installed in a ceiling, the sound pickup device 1C including the acoustic obstacle 50A is also similar. The sound pickup device 1C, as shown in FIG. 14C, in the case of being installed in a ceiling, does not pick up a sound in a range having a predetermined angle θ or less with respect to the ceiling surface.

In this way, the acoustic obstacle can be considered to take various kinds of shapes and arrangements appropriately according to a range in which sound pickup is blocked.

The description of the present preferred embodiment is illustrative in all respects, and should not be construed to be restrictive. The scope of the present invention is indicated by the appended claims rather than by the above-mentioned preferred embodiments. Furthermore, the scope of the present invention includes the scope of claims and equivalent scope of claims.

What is claimed is:

1. A sound pickup device comprising:
   a first microphone;
   a second microphone; and
   a housing, including a cylindrically shaped wall, providing a first portion and a second portion that is elevated in relation to the first portion, wherein:
      the first portion is located at a bottom of a radial center of the cylindrically shaped wall;
      the second portion is located at a top of the cylindrically shaped wall;
      the first microphone is disposed at the first portion and the second microphone is disposed at the second portion so that the housing blocks first sound from a first sound source from propagating to the first microphone in a predetermined direction range, while allowing the first sound to propagate to the second microphone unhindered in the predetermined direction range; and
   a gain controller that:
      compares a first characteristic amount of a first sound pickup signal of the first microphone and a second characteristic amount of a second sound pickup signal of the second microphone; and
      controls a gain of the first microphone or the second microphone in accordance with a result of comparing the first characteristic amount and the second characteristic amount.

2. The sound pickup device according to claim 1, wherein the gain controller controls the gain of the second microphone.

3. The sound pickup device according to claim 1, wherein the housing is configured to change the first characteristic amount and the second characteristic amount in a state where each of the first and second sound pickup signals includes second sound of a second sound source not included in the predetermined direction range.

4. The sound pickup device according to claim 1, wherein the first characteristic amount and the second characteristic amount include a signal level.

5. The sound pickup device according to claim 1, wherein the first characteristic amount and the second characteristic amount include variance of rise time in a different frequency.

6. The sound pickup device according to claim 1, wherein the gain controller reduces an output level with respect to an input level of the first or second microphone, in a state where a difference or a ratio between the first characteristic amount and the second characteristic amount is increased to more than or equal to a predetermined value.

7. The sound pickup device according to claim 1, wherein the gain controller changes an output level with respect to an input level of the first or second microphone in accordance with a change in a difference or a ratio between the first characteristic amount and the second characteristic amount.

8. The sound pickup device according to claim 1, wherein the predetermined direction range is a predetermined angle range with respect to a horizontal direction of an installation surface on which the sound pickup device is disposed.

9. The sound pickup device according to claim 8, wherein the predetermined direction range is an angle range of 16 degrees or less with respect to the horizontal direction.

10. The sound pickup device according to claim 1, the housing is made of a sound-absorbing material.

11. A sound pickup method for a sound pickup apparatus including:
- a first microphone;
- a second microphone; and
- a housing, including a cylindrically shaped wall, providing a first portion and a second portion that is elevated in relation to the first portion, wherein:
  - the first portion is located at a bottom of a radial center of the cylindrically shaped wall; and
  - the second portion is located at a top of the cylindrically shaped wall, the sound pickup method comprising:
- disposing the first microphone at the first portion and the second microphone at the second portion so that the housing blocks first sound from a first sound source from propagating to the first microphone in a predetermined direction range, while allowing the first sound to propagate to the second microphone unhindered in the predetermined direction range;
- comparing a first characteristic amount of a first sound pickup signal of the first microphone and a second characteristic amount of a second sound pickup signal of the second microphone; and
- controlling a gain of the first microphone or the second microphone in accordance with a result of the comparing.

12. The sound pickup method according to claim 11, wherein the controlling controls the gain of the second microphone.

13. The sound pickup method according to claim 11, wherein the housing is configured to change the first characteristic amount and the second characteristic amount in a state where each of the first and second sound pickup signals includes second sound of a second sound source not included in the predetermined direction range.

14. The sound pickup method according to claim 11, wherein the first characteristic amount and the second characteristic amount include a signal level.

15. The sound pickup method according to claim 11, wherein the first characteristic amount and the second characteristic amount include variance of rise time in a different frequency.

16. The sound pickup method according to claim 11, wherein the controlling reduces an output level with respect to an input level of the first or second microphone, in a state where a difference or a ratio between the first characteristic amount and the second characteristic amount is increased to more than or equal to a predetermined value.

17. The sound pickup method according to claim 11, wherein the controlling changes an output level with respect to an input level of the first or second microphone in accordance with a change in a difference or a ratio between the first characteristic amount and the second characteristic amount.

18. The sound pickup method according to claim 11, wherein the predetermined direction range is a predetermined angle range with respect to a horizontal direction of an installation surface on which the sound pickup device is disposed.

19. The sound pickup method according to claim 11, wherein the housing is made of a sound-absorbing material.

* * * * *